(12) United States Patent
Choi

(10) Patent No.: US 11,315,863 B2
(45) Date of Patent: Apr. 26, 2022

(54) PACKAGE SUBSTRATE AND METHOD OF MANUFACTURING THE PACKAGE SUBSTRATE, AND SEMICONDUCTOR PACKAGE INCLUDING THE PACKAGE SUBSTRATE AND METHOD OF MANUFACTURING THE SEMICONDUCTOR PACKAGE

(71) Applicant: Samsung Electronics Co., Ltd., Suwon-si (KR)

(72) Inventor: Keunho Choi, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/863,392

(22) Filed: Apr. 30, 2020

(65) Prior Publication Data

US 2021/0118790 A1   Apr. 22, 2021

(30) Foreign Application Priority Data

Oct. 22, 2019 (KR) .................. 10-2019-0131074

(51) Int. Cl.
*H01L 23/498* (2006.01)
*H01L 23/31* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC .......... H01L 23/3128; H01L 23/49822; H01L 23/49838; H01L 23/49827;
(Continued)

(56) References Cited

U.S. PATENT DOCUMENTS

| 8,222,738 B2 | 7/2012 | Ota et al. |
| 8,803,323 B2 | 8/2014 | Yu et al. |

(Continued)

FOREIGN PATENT DOCUMENTS

| JP | 4705448 B2 | 6/2011 |
| KR | 100818090 B1 | 3/2008 |

(Continued)

*Primary Examiner* — Jasmine J Clark
(74) *Attorney, Agent, or Firm* — Harness, Dickey & Pierce, P.L.C.

(57) ABSTRACT

A package substrate may include first conductive patterns, a first insulation layer and a second insulation layer. The first conductive patterns may be electrically connected with a semiconductor chip. The first insulation layer may be on an upper surface and side surfaces of each of the first conductive patterns. The first insulation layer may include at least one opening under at least one of side surfaces of the semiconductor chip. The second insulation layer may be on a lower surface of each of the first conductive patterns. Thus, a gas generated from the DAF may be readily discharged through the opening. A spreading of a crack, which may be generated at the interface between the side surface of the semiconductor chip and the molding member, toward the conductive patterns of the package substrate may be limited and/or suppressed. Adhesion between the semiconductor chip and the molding member may be reinforced.

20 Claims, 17 Drawing Sheets

(51) Int. Cl.
*H01L 21/48* (2006.01)
*H01L 21/56* (2006.01)
*H01L 23/13* (2006.01)
*H01L 23/00* (2006.01)
*H01L 25/065* (2006.01)

(52) U.S. Cl.
CPC ............ *H01L 21/565* (2013.01); *H01L 23/13* (2013.01); *H01L 23/3128* (2013.01); *H01L 23/49816* (2013.01); *H01L 23/49822* (2013.01); *H01L 23/49866* (2013.01); *H01L 24/16* (2013.01); *H01L 24/32* (2013.01); *H01L 24/33* (2013.01); *H01L 24/48* (2013.01); *H01L 24/73* (2013.01); *H01L 25/0657* (2013.01); *H01L 2224/16227* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01); *H01L 2225/06586* (2013.01)

(58) Field of Classification Search
CPC ... H01L 23/49816; H01L 23/13; H01L 24/73; H01L 24/48; H01L 23/562
See application file for complete search history.

(56) References Cited

U.S. PATENT DOCUMENTS

| | | |
|---|---|---|
| 9,111,913 B2 | 8/2015 | Choi |
| 2010/0221414 A1 | 9/2010 | Furuta et al. |
| 2019/0096814 A1* | 3/2019 | Wang ................. H01L 23/5383 |
| 2020/0105637 A1 | 4/2020 | Choi |

FOREIGN PATENT DOCUMENTS

| | | | |
|---|---|---|---|
| KR | 20130030039 A | 3/2013 | |
| KR | 101847163 B1 | 4/2018 | |
| KR | 20190043757 A | 4/2019 | |
| WO | WO-2013065287 A1 * | 5/2013 | ........... H01L 21/563 |

* cited by examiner

PACKAGE SUBSTRATE AND METHOD OF MANUFACTURING THE PACKAGE SUBSTRATE, AND SEMICONDUCTOR PACKAGE INCLUDING THE PACKAGE SUBSTRATE AND METHOD OF MANUFACTURING THE SEMICONDUCTOR PACKAGE

CROSS-RELATED APPLICATION

This application claims priority under 35 USC § 119 to Korean Patent Application No. 10-2019-0131074, filed on Oct. 22, 2019 in the Korean Intellectual Property Office (KIPO), the contents of which are herein incorporated by reference in their entirety.

BACKGROUND

1. Field

Example embodiments relate to a package substrate and a method of manufacturing the package substrate, and a semiconductor package and a method of manufacturing the package substrate. More particularly, example embodiments relate to a package substrate used for a semiconductor packaging process and a method of manufacturing the package substrate, and a semiconductor package and a method of manufacturing the package substrate.

2. Description of Related Art

Generally, a semiconductor package may include a package substrate, a semiconductor chip, a conductive wire and a molding member. The semiconductor chip may be attached to an upper surface of the package substrate using a die attach film (DAF). The conductive wire may be connected between the semiconductor chip and the package substrate. The molding member may be formed on the upper surface of the package substrate to cover the semiconductor chip and the conductive wire. The package substrate may include a conductive pattern and insulation layer arranged on an upper surface and a lower surface of the conductive pattern.

According to related arts, during a process for attaching the semiconductor chip to the package substrate using the DAF and/or a process for forming the molding member, a gas including a volatile material may be discharged from the DAF. The gas may form a void at a portion of the molding member adjacent to a side surface of the semiconductor chip to weaken an adhesion force between the semiconductor chip and the molding member.

Further, in order to test reliability of the semiconductor package, the semiconductor package may be exposed to high and low temperatures and high humidity. Stresses generated in the test may be concentrated on an interface between the side surface of the semiconductor chip and the molding member to generate a delamination and/or a crack at the interface. Particularly, the void in the interface between the semiconductor chip and the molding member may function as to accelerate the delamination and/or the crack. The crack may spread into the package substrate to damage the package substrate.

SUMMARY

Example embodiments provide a package substrate that may be capable of reinforcing an adhesion force of an interface between a semiconductor chip and a molding member, suppressing a crack spread generated at the interface, and limiting and/or preventing a generation of a void at the interface.

Example embodiments also provide a method of manufacturing the above-mentioned package substrate.

Example embodiments also provide a semiconductor package including the above-mentioned package substrate.

Example embodiments also provide a method of manufacturing the above-mentioned semiconductor package.

According to example embodiments, there may be provided a package substrate. The package substrate may include first conductive patterns, a first insulation layer, and a second insulation layer. The first conductive patterns may be electrically connected with a semiconductor chip. The first insulation layer may be on an upper surface and side surfaces of each of the first conductive patterns. The first insulation layer may include an opening under at least one of side surfaces of the semiconductor chip. The second insulation layer may be on a lower surface of each of the first conductive patterns.

According to example embodiments, there may be provided a package substrate. The package substrate may include a core insulation layer, first conductive patterns, a first insulation layer, a reinforcement pattern, second conductive patterns, and a second insulation layer. The first conductive patterns may be on an upper surface of the core insulation layer. The first conductive patterns may be electrically connected with a semiconductor chip. The first insulation layer may be on an upper surface and side surfaces of each of the first conductive patterns. The first insulation layer may include an opening under at least one of side surfaces of the semiconductor chip to expose at least one of the first conductive patterns. The reinforcement pattern may be on the first conductive pattern exposed through the opening. The second conductive patterns may be on a lower surface of the core insulation layer. The second conductive patterns may be electrically connected with the first conductive patterns. The second insulation layer may be on a lower surface of each of the second conductive patterns.

According to example embodiments, there may be provided a package substrate. The package substrate may include a core insulation layer, first conductive patterns, a first insulation layer, reinforcement patterns, second conductive patterns, and a second insulation layer. The first conductive patterns may be on an upper surface of the core insulation layer. The first conductive patterns may be electrically connected with a semiconductor chip. The first insulation layer may be on an upper surface and side surfaces of each of the first conductive patterns. The first insulation layer may include an opening under at least one of side surfaces of the semiconductor chip to expose the upper surface and the side surfaces of each of the first conductive patterns. The reinforcement patterns may be spaced apart from a lower surface of the semiconductor chip to form a vertical gap. The reinforcement patterns may be spaced apart from each other along a horizontal direction to form a horizontal gap. The second conductive patterns may be on a lower surface of the core insulation layer. The second conductive patterns may be electrically connected with the first conductive patterns. The second insulation layer may be on a lower surface of each of the second conductive patterns.

According to example embodiments, there may be provided a method of manufacturing a package substrate. In the method of manufacturing the package substrate, a first insulation layer may be formed on an upper surface and side surfaces of each of first conductive patterns connected with a semiconductor chip. An opening may be formed at a portion of the first insulation layer positioned under at least one of side surfaces of the semiconductor chip. A second insulation layer may be formed on a lower surface of each of the first conductive patterns.

According to example embodiments, there may be provided a semiconductor package. The semiconductor package may include a semiconductor chip, a package substrate and a molding member. The package substrate may include first conductive patterns, a first insulation layer, and a second insulation layer. The first conductive patterns may be electrically connected with the semiconductor chip. The first insulation layer may be on an upper surface and a side surface of each of the first conductive patterns. The first insulation layer may include an opening positioned under at least one of side surfaces of the semiconductor chip. The second insulation layer may be arranged on a lower surface of the first conductive patterns. The molding member may be on an upper surface of the package substrate to cover the side surfaces and an upper surface of the semiconductor chip. The molding member may include a burying portion configured to bury the opening.

According to example embodiments, there may be provided a semiconductor package. The semiconductor package may include a semiconductor chip, a package substrate, and a molding member. The package substrate may include a core insulation layer, first conductive patterns, a first insulation layer, a reinforcement pattern, second conductive patterns, and a second insulation layer. The core insulation layer may be under the semiconductor chip. The first conductive patterns may be on an upper surface of the core insulation layer. The first conductive patterns may be electrically connected with a semiconductor chip. The first insulation layer may be on an upper surface and side surfaces of each of the first conductive patterns. The first insulation layer may include an opening under at least one of side surfaces of the semiconductor chip to expose any one of the first conductive patterns. The reinforcement pattern may be on the first conductive pattern exposed through the opening. The second conductive patterns may be on a lower surface of the core insulation layer. The second conductive patterns may be electrically connected with the first conductive patterns. The second insulation layer may be on a lower surface of each of the second conductive patterns. The molding member may be on an upper surface of the package substrate to cover the side surfaces and an upper surface of the semiconductor chip. The molding member may include a burying portion configured to bury the opening.

According to example embodiments, there may be provided a semiconductor package. The semiconductor package may include a semiconductor chip, a package substrate, a conductive wire and a molding member. The package substrate may include a core insulation layer, first conductive patterns, a first insulation layer, reinforcement patterns, second conductive patterns and a second insulation layer. The first conductive patterns may be on an upper surface of the core insulation layer. The first conductive patterns may be electrically connected with a semiconductor chip. The first insulation layer may be on an upper surface and side surfaces of each of the first conductive patterns. The first insulation layer may include an opening under at least one of side surfaces of the semiconductor chip to expose the upper surface and the side surfaces of each of the first conductive patterns. The reinforcement patterns may be spaced apart from a lower surface of the semiconductor chip to form a vertical gap. The reinforcement patterns may be spaced apart from each other in a horizontal direction to form a horizontal gap. The second conductive patterns may be on a lower surface of the core insulation layer. The second conductive patterns may be electrically connected with the first conductive patterns. The second insulation layer may be on a lower surface of each of the second conductive patterns. The conductive wire may be electrically connected between the semiconductor chip and the package substrate. The molding member may be on an upper surface of the package substrate to cover the side surfaces and an upper surface of the semiconductor chip and the conductive wire. The molding member may include a burying portion configured to bury the opening.

According to example embodiments, there may be provided a semiconductor package. The semiconductor package may include a semiconductor chip, a package substrate, a conductive wire, and a molding member. The package substrate may include a core insulation layer under the semiconductor chip, first conductive patterns on an upper surface of the core insulation layer and electrically connected with a semiconductor chip, a first insulation layer on an upper surface and a side surface of each of the first conductive patterns, reinforcement patterns, second conductive patterns, and a second insulation layer. The first insulation layer may include an opening under at least one of side surfaces of the semiconductor chip to expose an upper surface and a side surface of each of the first conductive patterns. The reinforcement patterns may be on the upper surface of each of the first conductive patterns exposed through the opening. The reinforcement patterns may be spaced apart from a lower surface of the semiconductor chip to form a vertical gap, and the reinforcement patterns may be spaced apart from each other along a horizontal direction to form a horizontal gap. The second conductive patterns may be on a lower surface of the core insulation layer and electrically connected with the first conductive patterns. The second insulation layer may be on lower surfaces of the second conductive patterns. The conductive wire may be configured to electrically connect the semiconductor chip with the package substrate. The molding member may be on an upper surface of the package substrate to cover an upper surface and the side surfaces of the semiconductor chip. The molding member may include a burying portion configured to bury the opening, a vertical interlocking portion inserted into the vertical gap, and a horizontal interlocking portion inserted into the horizontal gap.

According to example embodiments, there may be provided a method of manufacturing a semiconductor package. In the method of manufacturing the semiconductor package, a semiconductor chip may be on a package substrate. The package substrate may include first conductive patterns, a first insulation layer and a second insulation layer. The first conductive patterns may be electrically connected with the semiconductor chip. The first insulation layer may be on an upper surface and side surfaces of each of the first conductive patterns. The first insulation layer may include an opening positioned under at least one of side surfaces of the semiconductor chip. The second insulation layer may be on lower surfaces of the first conductive patterns. The semiconductor chip may be electrically connected with the first conductive patterns. A molding member may be on an upper surface of the package substrate and the side surfaces and an upper surface of the semiconductor chip. The molding member may include a burying portion configured to bury the opening.

According to example embodiments, the opening may be formed at the portion of the first insulation layer under the interface between the side surface of the semiconductor chip and the molding member. Thus, during a process for attaching the semiconductor chip with the package substrate using a die attach film (DAF) and/or a process for forming the molding member, a gas generated from the DAF may be readily discharged through the opening. As a result, a void may not be generated in the interface between the semiconductor chip and the molding member.

Further, the opening may be filled with the molding member. Because the molding member may have stiffness stronger than that of the first insulation layer, a spreading of a crack, which may be generated at the interface between the side surface of the semiconductor chip and the molding member, toward the conductive patterns of the package substrate may be suppressed. Furthermore, the reinforcement pattern on the conductive pattern of the package substrate exposed through the opening may suppress the spreading of the crack toward the package substrate. Thus, damages to the conductive patterns of the package substrate by the crack may be limited and/or prevented.

Particularly, the conductive pattern and the reinforcement pattern may form the horizontal gap and the vertical gap filled with the molding member by the opening. Therefore, the conductive pattern and the reinforcement pattern may form an interlock structure having an unevenness shape together with the molding member in the horizontal gap and the vertical gap to reinforce an adhesion force between the semiconductor chip and the molding member.

BRIEF DESCRIPTION OF THE DRAWINGS

Example embodiments will be more clearly understood from the following detailed description taken in conjunction with the accompanying drawings.

FIG. 1 is a cross-sectional view illustrating a package substrate in accordance with example embodiments;

FIG. 2 is a plan view illustrating the package substrate in FIG. 1;

FIG. 3 is an enlarged plan view illustrating a portion "A" in FIG. 2;

FIG. 4 is a cross-sectional view taken along a line B-B' in FIG. 3;

FIGS. 5 and 6 are cross-sectional views illustrating a method of manufacturing the package substrate in FIG. 1;

FIG. 7 is a plan view illustrating a package substrate in accordance with example embodiments;

FIG. 8 is a cross-sectional view illustrating a package substrate in accordance with example embodiments;

FIG. 9 is a plan view illustrating the package substrate in FIG. 8;

FIG. 10 is a cross-sectional view illustrating a package substrate in accordance with example embodiments;

FIG. 11 is a plan view illustrating the package substrate in FIG. 10;

FIG. 12 is a cross-sectional view illustrating a package substrate in accordance with example embodiments;

FIG. 13 is a plan view illustrating the package substrate in FIG. 12;

FIG. 14 is an enlarged plan view illustrating a portion "C" in FIG. 13;

FIG. 15 is a cross-sectional view taken along a line D-D' in FIG. 14;

FIG. 16 is a cross-sectional view illustrating a package substrate in accordance with example embodiments;

FIG. 17 is a cross-sectional view taken along a line E-E' in FIG. 16;

FIG. 18 is a cross-sectional view illustrating a semiconductor package including the package substrate in FIG. 1 in accordance with example embodiments;

FIG. 19 is an enlarged cross-sectional view illustrating a portion "F" in FIG. 18;

FIG. 20 is a cross-sectional view taken along a line G-G' in FIG. 19;

FIGS. 21 to 23 are cross-sectional views illustrating a method of manufacturing the semiconductor package in FIG. 18;

FIG. 24 is a cross-sectional view illustrating a semiconductor package including the package substrate in FIG. 12 in accordance with example embodiments;

FIG. 25 is an enlarged cross-sectional view illustrating a portion "H" in FIG. 24;

FIG. 26 is a cross-sectional view taken along a line I-I' in FIG. 25;

FIG. 27 is a cross-sectional view illustrating a semiconductor package including the package substrate in FIG. 16 in accordance with example embodiments;

FIG. 28 is an enlarged cross-sectional view illustrating a portion "J" in FIG. 27;

FIG. 29 is a cross-sectional view taken along a line K-K' in FIG. 28;

FIG. 30 is a cross-sectional view illustrating a semiconductor package including the package substrate in FIG. 12 in accordance with example embodiments; and FIG. 31 is a cross-sectional view illustrating a semiconductor package including the package substrate in FIG. 12 in accordance with example embodiments.

DETAILED DESCRIPTION

As used herein, the singular forms "a," "an" and "the" are intended to include the plural forms as well, unless the context clearly indicates otherwise.

Hereinafter, example embodiments will be explained in detail with reference to the accompanying drawings.

Package Substrate

Figure 1:
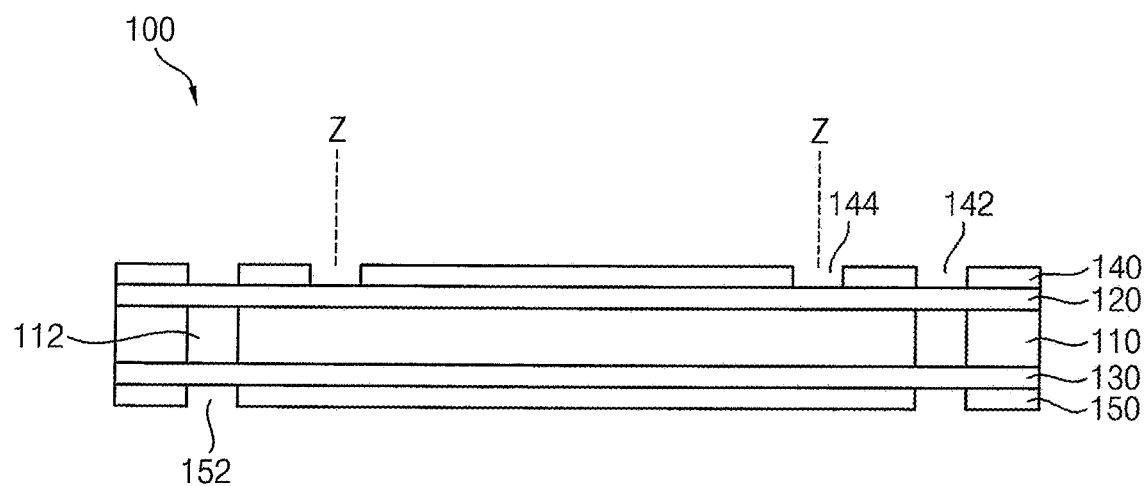
FIGS. 1 to 31 represent non-limiting, example embodiments as described herein.
Figure 2:
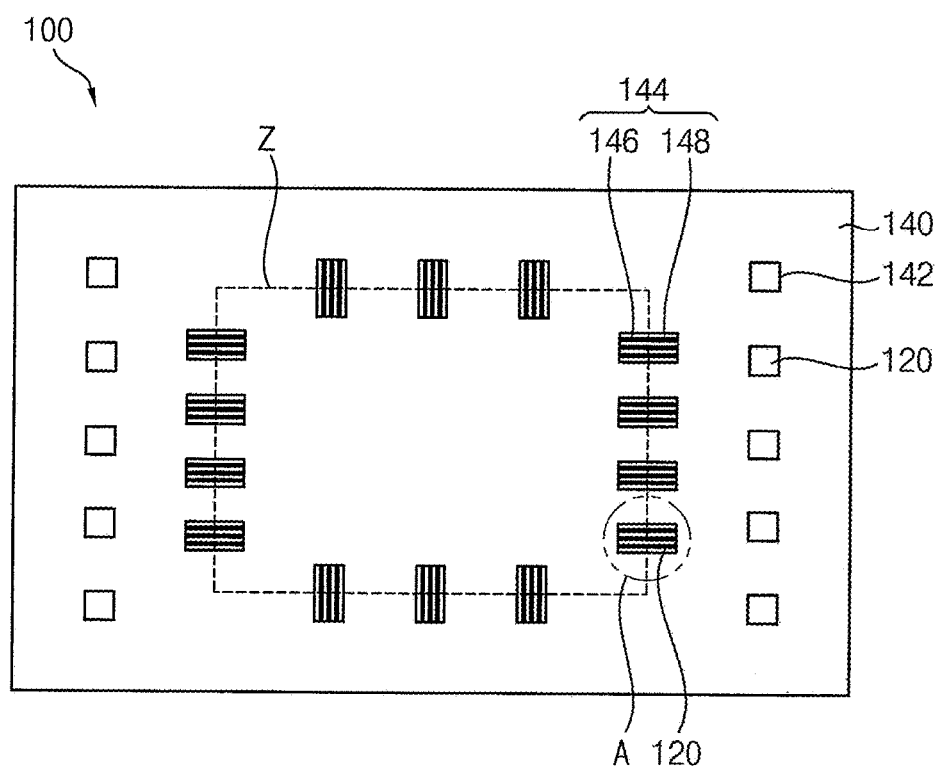
Figure 3:
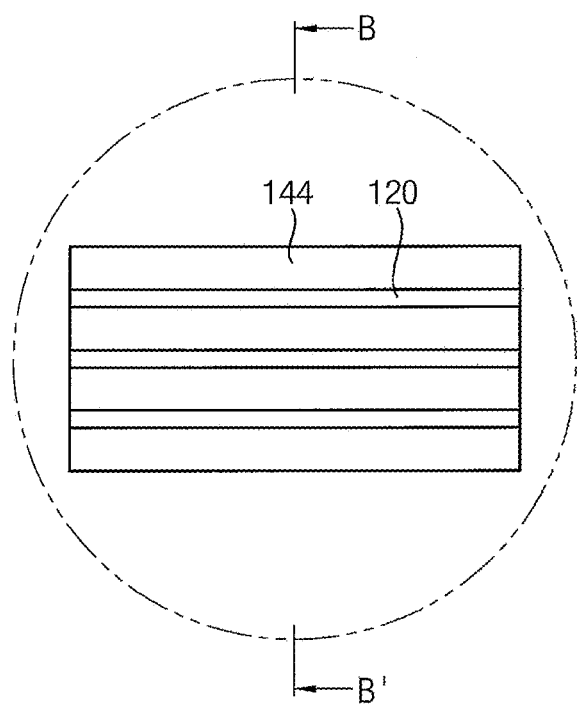
Figure 4:
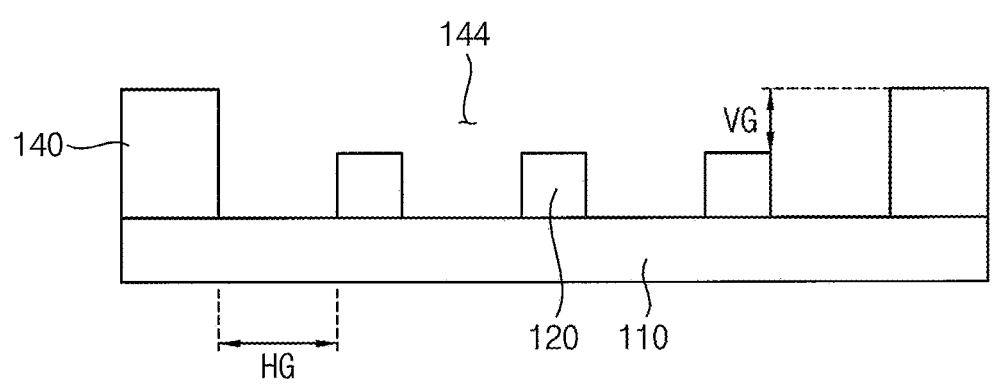

FIG. 1 is a cross-sectional view illustrating a package substrate in accordance with example embodiments, FIG. 2 is a plan view illustrating the package substrate in FIG. 1, FIG. 3 is an enlarged plan view illustrating a portion "A" in FIG. 2, and FIG. 4 is a cross-sectional view taken along a line B-B' in FIG. 3.

Referring to FIGS. 1 to 4, a package substrate 100 of this example embodiment ma include a core insulation layer 110, first conductive patterns 120, second conductive patterns 130, a first insulation layer 140 and a second insulation layer 150.

The first conductive patterns 120 may be arranged on an upper surface of the core insulation layer 110. The first conductive patterns 120 may be extended on the upper surface of the core insulation layer 110 along a horizontal direction. The first conductive patterns 120 may be arranged spaced apart from each other along the horizontal direction. Horizontal distances between the first conductive patterns 120 may be substantially equal or different from each other. The first conductive patterns 120 may include a metal such as copper, aluminum, etc.

The second conductive patterns 130 may be arranged on a lower surface of the core insulation layer 110. The second conductive patterns 130 may be extended on the lower surface of the core insulation layer 110 along the horizontal direction. The second conductive patterns 130 may be arranged spaced apart from each other along the horizontal direction. Horizontal distances between the second conductive patterns 130 may be substantially equal or different from each other. The second conductive patterns 130 may include a metal such as copper, aluminum, etc. The second conductive patterns 130 may be electrically connected with the first conductive patterns 120 via contacts 112 vertically formed through the core insulation layer 110.

The first insulation layer 140 may be formed on the upper surface of the core insulation layer 110 to cover the first conductive patterns 120. Particularly, the first insulation layer 140 may be configured to cover an upper surface and side surfaces of each of the first conductive patterns 120. The side surfaces of each of the first conductive patterns 120 may be substantially parallel to the horizontal direction. That is, the first insulation layer 140 may be formed between the side surfaces of the first conductive patterns 120. The first insulation layer 140 may include a solder resist.

A semiconductor chip may be arranged on an upper surface of the first insulation layer 140. A lower surface of the semiconductor chip may be attached to the upper surface of the first insulation layer 140 using a die attach film (DAF). The semiconductor chip may be positioned at a central portion of the upper surface of the first insulation layer 140.

The first insulation layer 140 may include a plurality of pad openings 142. The pad openings 142 may be formed through an edge portion of the first insulation layer 140 outside a side surface Z of the semiconductor chip to expose the first conductive patterns 120. Pads of the semiconductor chip may be electrically connected with the first conductive patterns exposed through the pad openings 142. Alternatively, the pad openings 142 may be formed through an edge portion of the first insulation layer 140 under the lower surface of the semiconductor chip to expose the first conductive patterns 120. The pads of the semiconductor chip may be electrically connected with the first conductive patterns 120 exposed through the pad openings 142.

The first insulation layer 140 may include at least one opening 144. The opening 144 may be formed through a portion of the first insulation layer 140 under the side surface of the semiconductor chip. The opening 144 may function as a discharge passage of a gas generated in a process for attaching the semiconductor chip to the package substrate 100 and/or a process for a molding member illustrated later. Further, the opening 144 may be filled with the molding member to have functions for reinforcing an adhesion force at an interface between the semiconductor chip and the molding member and for suppressing a spreading of a crack generated at the interface between the semiconductor chip and the molding member. Thus, the side surface Z of the semiconductor chip may correspond to the interface of the semiconductor chip and the molding member.

In example embodiments, the opening 144 may be arranged along all of the side surfaces Z of the semiconductor chip. Alternatively, the opening 144 may be positioned under one side surface, two side surfaces or three side surfaces among total side surfaces Z of the semiconductor chip. The opening 144 may have a rectangular shape. Alternatively, the opening 144 may have other shapes such as a triangular shape, a circular shape, etc.

Each of openings 144 may be extended in the horizontal direction. Thus, each of the openings 144 may include an inner opening 146 positioned inside the side surface Z of the semiconductor chip, and an outer opening 148 extended from the inner opening 146 and positioned outside the side surface Z of the semiconductor chip. The inner opening 146 may have a length substantially the same as that of the outer opening 148. Alternatively, the length of the inner opening 146 may be different from the length of the outer opening 148. For example, the length of the inner opening 146 may be shorter or longer than the length of the outer opening 148.

Each of the openings 144 may be configured to expose at least one of the first conductive patterns 120. That is, a portion of the first conductive pattern 120 under the side surface of the semiconductor chip may be exposed through the opening 144. Further, portions of the upper surface of the core insulation layer 110 under the side surface Z of the semiconductor chip may also be exposed through the opening 144. Because the upper surface of the first conductive pattern 120 may be lower than the upper surface of the first insulation layer 140, a vertical gap VG may be formed between the upper surface of the first conductive pattern 120 and the lower surface of the semiconductor chip, i.e., a lower surface of the DAF. Further, Horizontal gaps HG may be formed between the side surfaces of the first conductive patterns 120, and between the side surface of the first conductive pattern 120 and an inner surface of the opening 144.

In example embodiments, the three first conductive patterns 120 may be exposed through one opening 144. Particularly, the upper surface and the side surfaces of each of the three first conductive patterns 120 may be exposed through the opening 144. Thus, the first conductive patterns 120 exposed through the opening 144 may form a lower unevenness structure. Alternatively, the opening 144 may be configured to expose only the upper surface of the core insulation layer 110, not expose the first conductive pattern 120. In this case, the opening 144 may be formed at a portion of the first insulation layer 140 under which the first conductive pattern 120 may not be arranged.

The second insulation layer 150 may be arranged on the lower surface of the core insulation layer 110 to cover the second conductive patterns 130. The second insulation layer 150 may include openings 152 configured to expose the second conductive patterns 130. External terminals such as solder balls may be mounted on the second conductive patterns 130 exposed through the openings 152.

In example embodiments, the package substrate 100 may include the two-layered conductive patterns 120 and 130. Alternatively, the package substrate 100 may include one-layered conductive patterns or at least three-layered conductive patterns.

Figure 5:
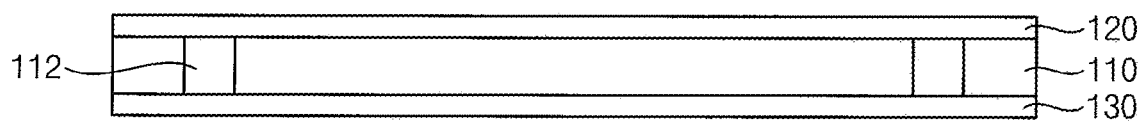
Figure 6:
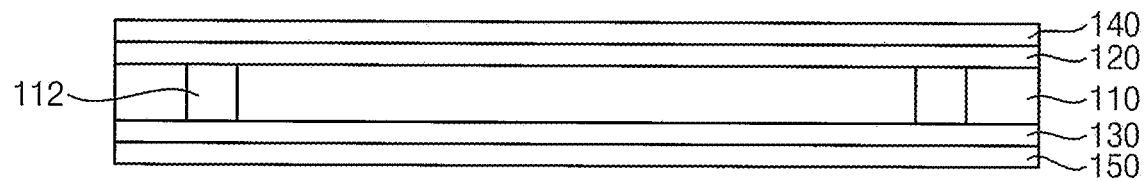

FIGS. 5 and 6 are cross-sectional views illustrating a method of manufacturing the package substrate in FIG. 1.

Referring to FIG. 5, the first conductive patterns 120 may be formed on the upper surface of the core insulation layer 110. The second conductive patterns 130 may be formed on the lower surface of the core insulation layer 110. The first and second conductive patterns 120 and 130 may be formed by forming conductive layers on the upper and lower surfaces of the core insulation layer 110, respectively, and by patterning the conductive layers. The first and second conductive patterns 120 and 130 may be electrically connected with each other via the contacts 112 formed through the core insulation layer 110.

Referring to FIG. 6, the first insulation layer 140 may be formed on the first conductive patterns 120. The second insulation layer 150 may be formed on the second conductive patterns 130.

The first insulation layer 140 may be partially removed by an etching process to form the pad openings 142 and the openings 144 configured to expose the first conductive patterns 120. As mentioned above, the openings 144 may be positioned under the side surface Z of the semiconductor chip. The second insulation layer 150 may be partially removed to form the openings 152 configured to expose the second conductive patterns 130, thereby completing the package substrate 100 in FIG. 1.

Figure 7:
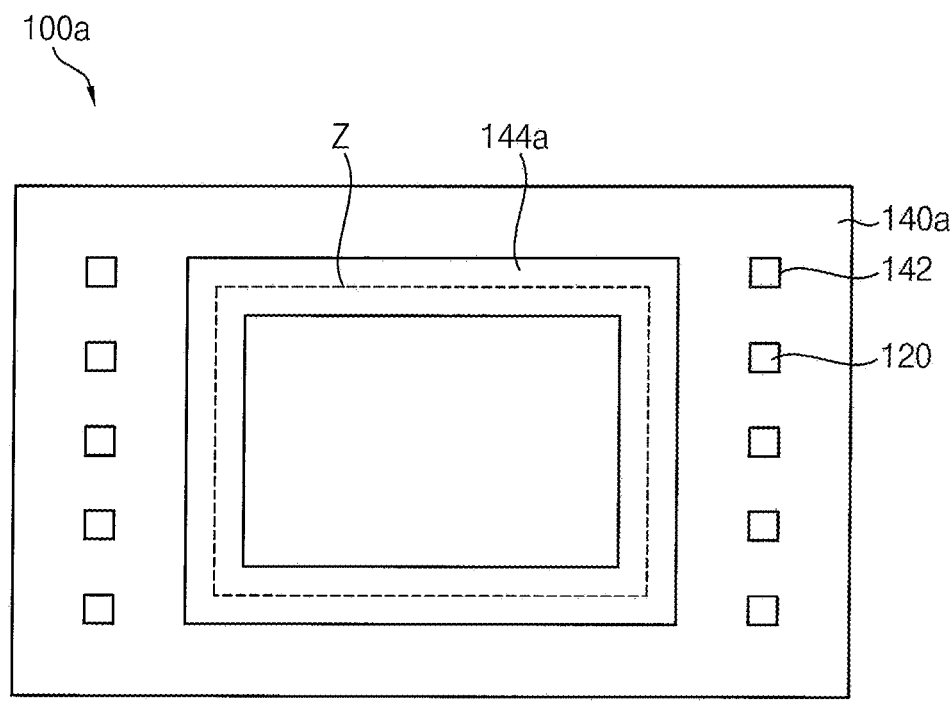

FIG. 7 is a plan view illustrating a package substrate in accordance with example embodiments.

A package substrate 100*a* of this example embodiment may include elements substantially the same as those of the package substrate 100 in FIG. 1 except for an opening. Thus, the same reference numerals may refer to the same elements and any further illustrations with respect to the same elements may be omitted herein for brevity.

Referring to FIG. 7, an opening 144*a* of a first insulation layer 140*a* in accordance with this example embodiment may be a single opening extended along all of the side surfaces Z of the semiconductor chip. That is, the opening 144*a* may have a rectangular frame shame positioned under the four side surfaces Z of the semiconductor chip.

Figure 8:
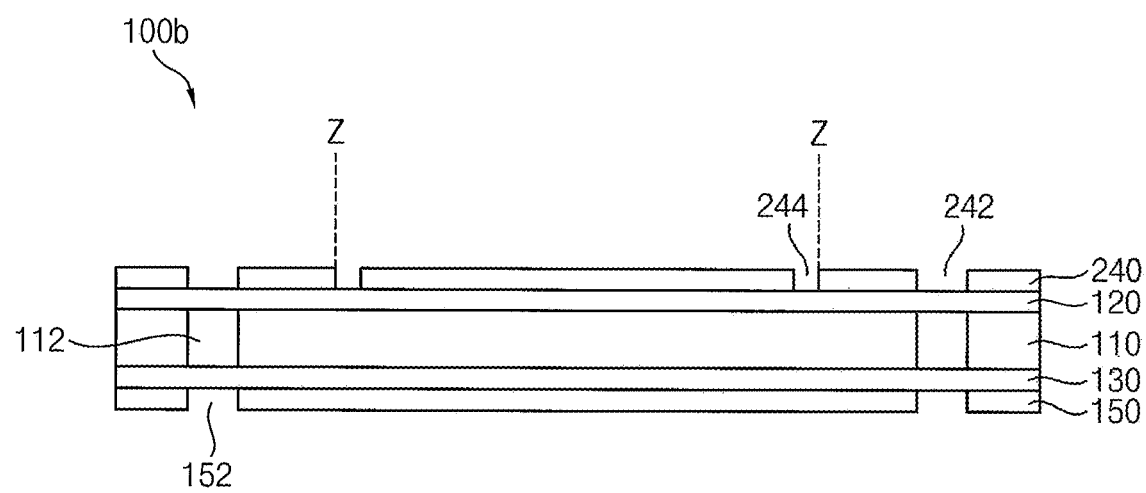
Figure 9:
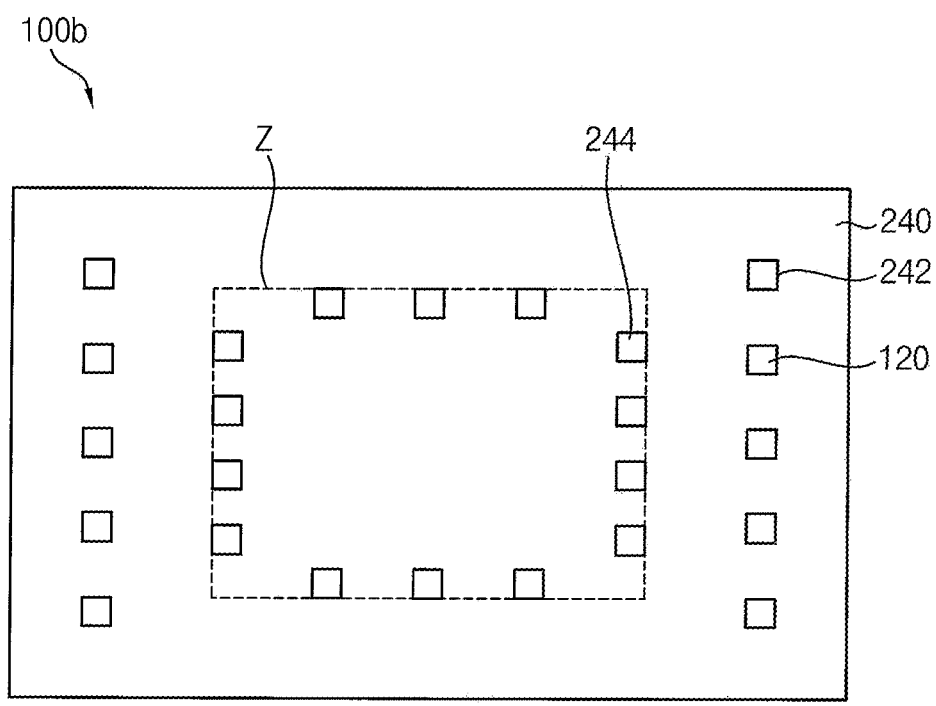

FIG. 8 is a cross-sectional view illustrating a package substrate in accordance with example embodiments, and FIG. 9 is a plan view illustrating the package substrate in FIG. 8.

A package substrate 100*b* of this example embodiment may include elements substantially the same as those of the package substrate 100 in FIG. 1 except for an opening. Thus, the same reference numerals may refer to the same elements and any further illustrations with respect to the same elements may be omitted herein for brevity.

Referring to FIGS. 8 and 9, a first insulation layer 240 of this example embodiment may include a pad opening 242 and an opening 244. The pad opening 242 may be substantially the same as the pad opening 142 in FIGS. 1 and 2. Thus, any further illustrations with respect to the pad opening 242 may be omitted herein for brevity.

The opening 244 may be positioned only inside the side surface Z of the semiconductor chip. That is, the opening 244 may correspond to the inner opening 146 in FIG. 2.

Figure 10:
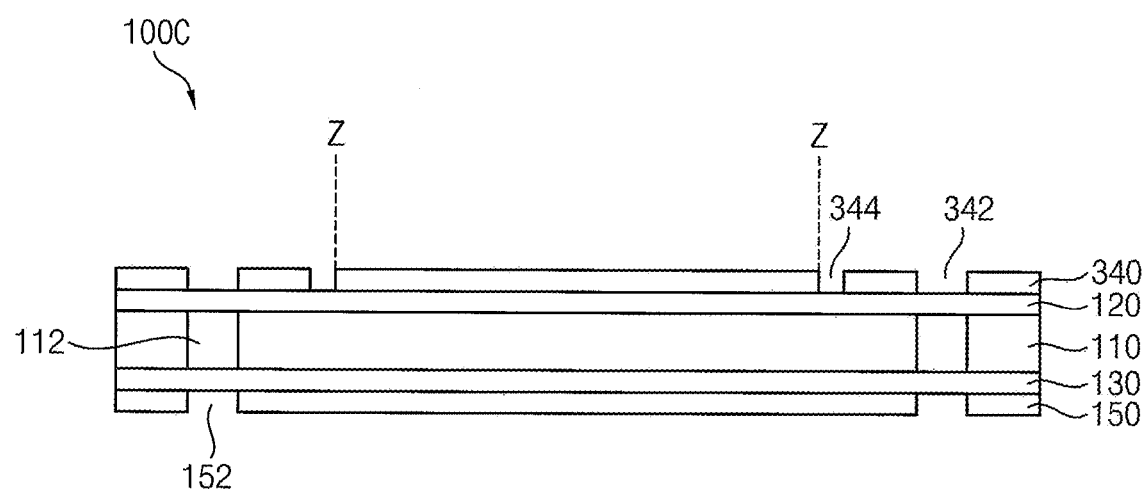
Figure 11:
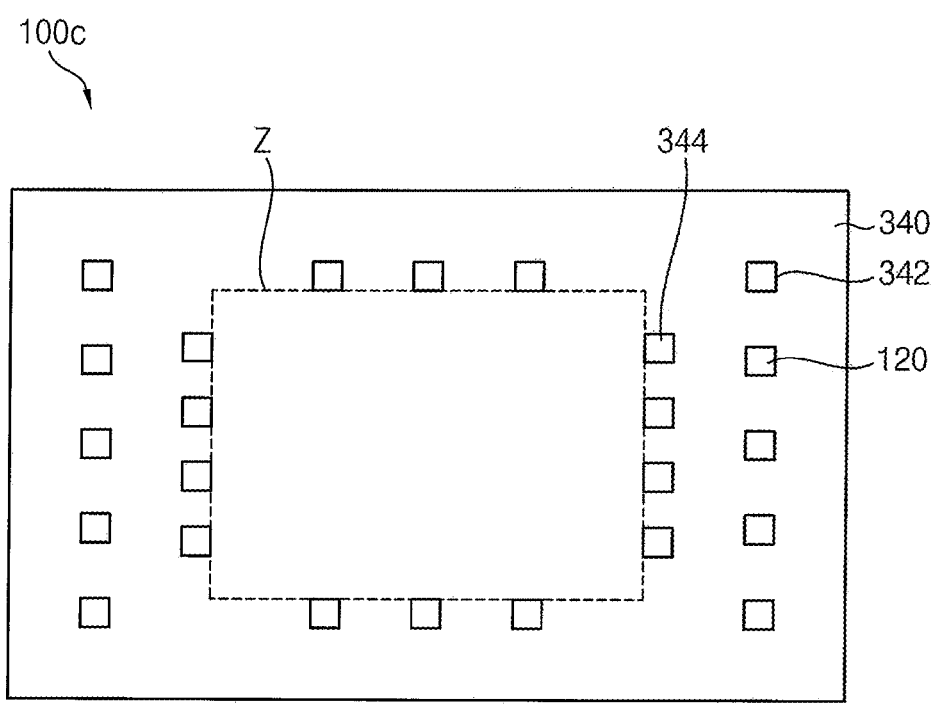

FIG. 10 is a cross-sectional view illustrating a package substrate in accordance with example embodiments, and FIG. 11 is a plan view illustrating the package substrate in FIG. 10.

A package substrate 100*c* of this example embodiment may include elements substantially the same as those of the package substrate 100 in FIG. 1 except for an opening. Thus, the same reference numerals may refer to the same elements and any further illustrations with respect to the same elements may be omitted herein for brevity.

Referring to FIGS. 10 and 1, a first insulation layer 340 of this example embodiment may include a pad opening 342 and an opening 344. The pad opening 342 may be substantially the same as the pad opening 142 in FIGS. 1 and 2. Thus, any further illustrations with respect to the pad opening 342 may be omitted herein for brevity.

The opening 344 may be positioned only outside the side surface Z of the semiconductor chip. That is, the opening 344 may correspond to the outer opening 148 in FIG. 2.

Figure 12:
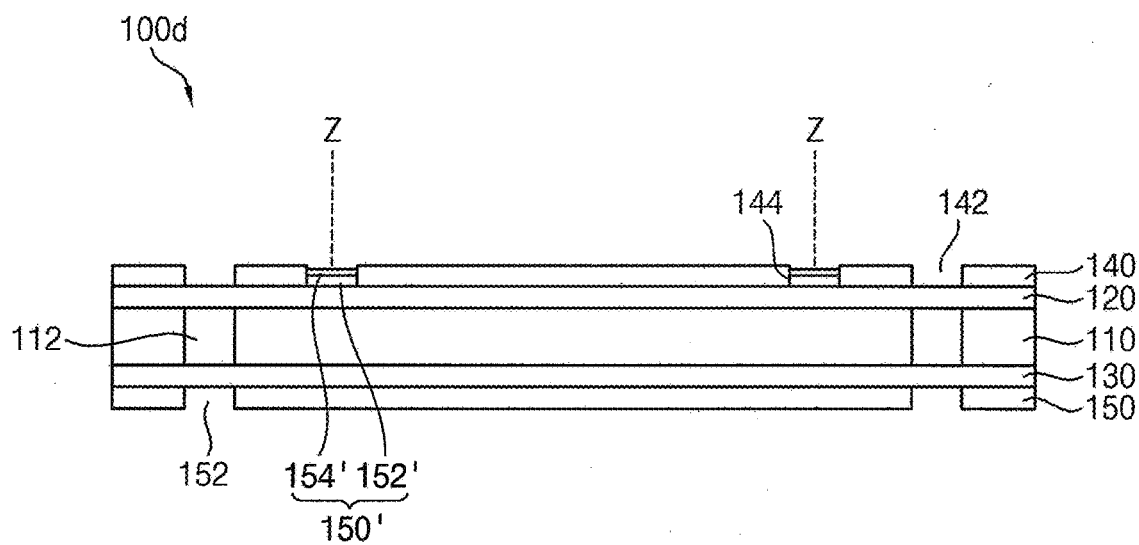
Figure 13:
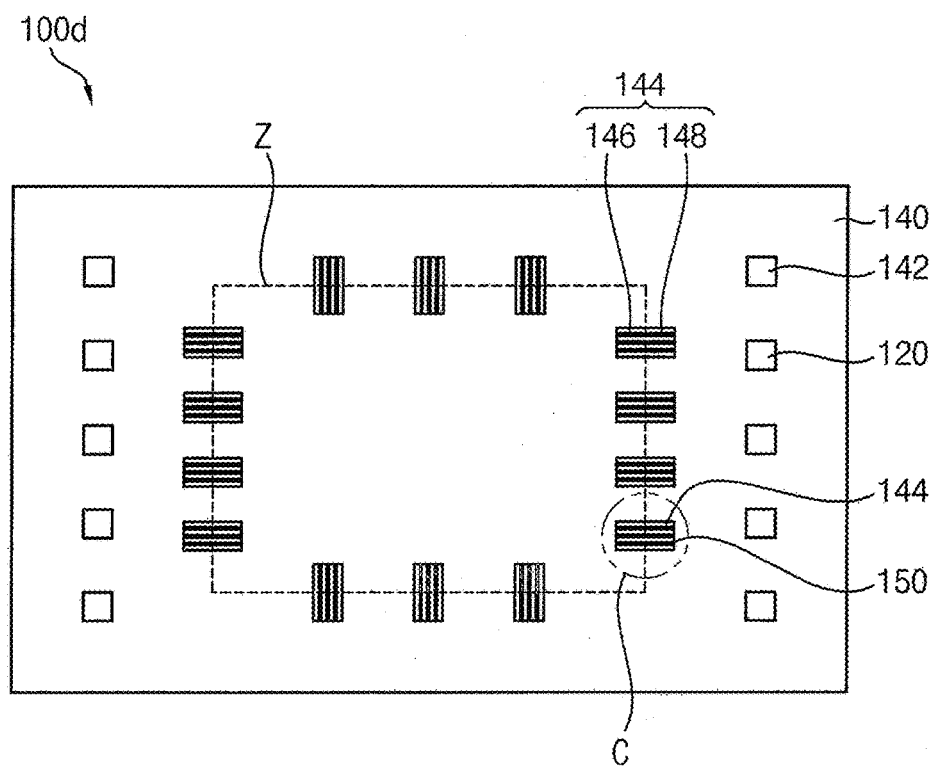
Figure 14:
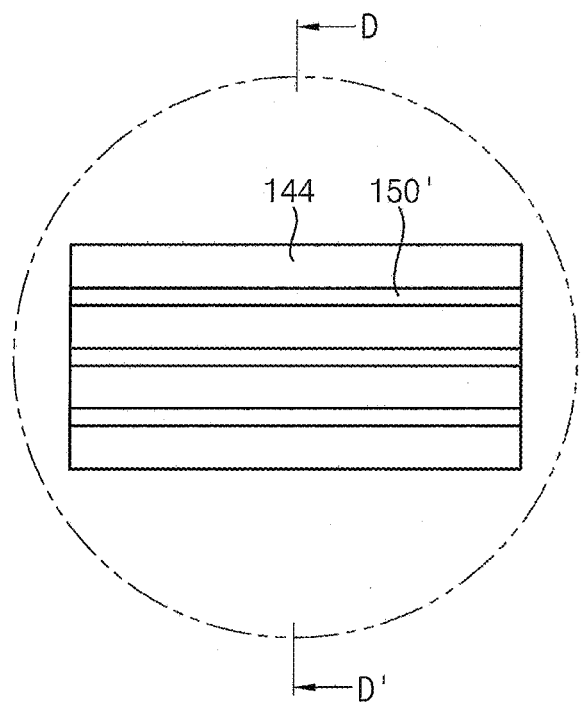
Figure 15:
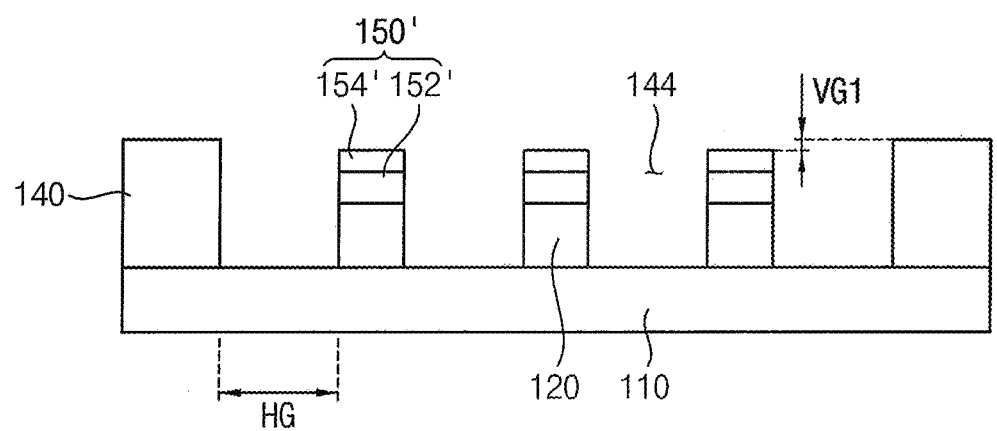

FIG. 12 is a cross-sectional view illustrating a package substrate in accordance with example embodiments, FIG. 13 is a plan view illustrating the package substrate in FIG. 12, FIG. 14 is an enlarged plan view illustrating a portion "C" in FIG. 13, and FIG. 15 is a cross-sectional view taken along a line D-D' in FIG. 14.

A package substrate 100*d* of this example embodiment may include elements substantially the same as those of the package substrate 100 in FIG. 1 except for further including reinforcement patterns. Thus, the same reference numerals may refer to the same elements and any further illustrations with respect to the same elements may be omitted herein for brevity.

Referring to FIGS. 12 to 14, each of reinforcement patterns 150' may be arranged on the upper surface of each of the first conductive patterns 120 exposed through the opening 144. The reinforcement pattern 150' may be formed by a plating process. The reinforcement pattern 150' may function as to suppress a spreading of a crack, which may be generated at the interface between the semiconductor chip and the molding member, to the first conductive pattern 120.

Because the upper surface and the side surfaces of the first conductive pattern 120 may be exposed through the opening 144, an upper surface and side surfaces of the reinforcement pattern 150' may also be exposed through the opening 144. Thus, structures including the first conductive pattern 120 and the reinforcement pattern 150' may form a lower unevenness structure in the opening 144.

In example embodiments, the reinforcement pattern 150' may have a thickness less than that of the first insulation layer 140. Thus, a vertical gap VG1 may be formed between the upper surface of the reinforcement pattern 150' and the lower surface of the semiconductor chip, particularly, the lower surface of the DAF. The vertical gap VG1 may have a vertical length shorter than a vertical length of the vertical gap VG in FIG. 4. Further, the reinforcement pattern 150' may have a width substantially the same as that of the first conductive pattern 120. Thus, horizontal gaps HG1 may be formed between the side surface of the first conductive pattern 120 and the side surface of the reinforcement pattern 150', and between the side surfaces of the first conductive pattern 120 and the reinforcement pattern 150' and the inner surface of the opening 144. The horizontal gap VG1 may have a horizontal length substantially the same as that of the horizontal gap VG in FIG. 4.

In example embodiments, the reinforcement pattern 150' may include a first pattern 152' and a second pattern 154'. The first pattern 152' may be arranged on the upper surface of the first conductive pattern 120. The second pattern 154' may be arranged on an upper surface of the first pattern 152'. The second pattern 154' may have an upper surface configured to form the vertical gap VG1 together with the lower surface of the semiconductor chip.

The first pattern 152' may function as to a barrier for suppressing a metal in the first conductive pattern from upwardly diffusing. The first pattern 152' may include nickel. The second pattern 154' may function as to reinforce an adhesion force between the reinforcement pattern 150' and the molding member. The second pattern 154' may include gold. Alternatively, the reinforcement pattern 150' may include a single layer or at least three-layered structure.

A method of manufacturing the package substrate 100*d* may include processes substantially the same as those illustrated with reference to FIGS. 5 and 6 except for further including the plating process for forming the reinforcement pattern 150'. Thus, any further illustrations with respect to the method of forming the package substrate 100*d* may be omitted herein for brevity.

Figure 16:
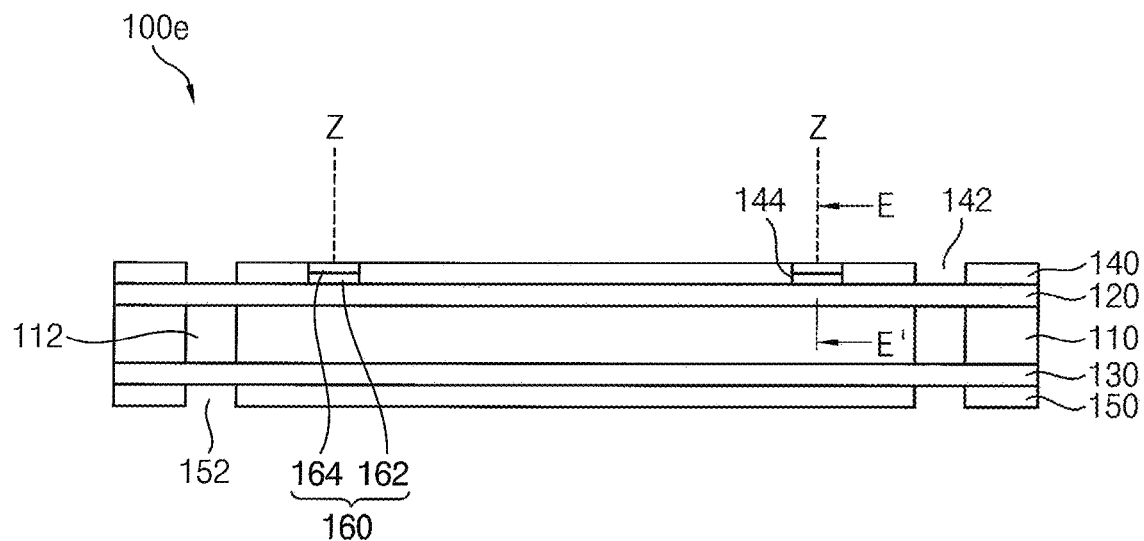
Figure 17:
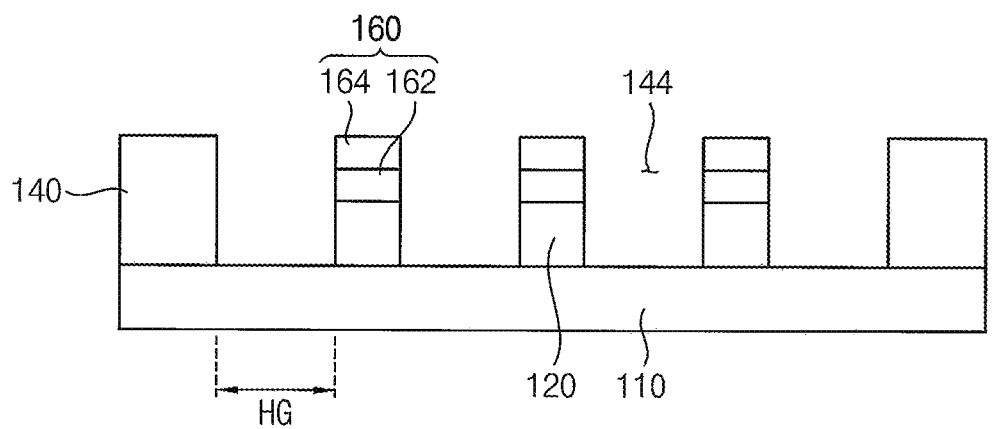

FIG. 16 is a cross-sectional view illustrating a package substrate in accordance with example embodiments, and FIG. 17 is a cross-sectional view taken along a line E-E' in FIG. 16.

A package substrate 100*e* of this example embodiment may include elements substantially the same as those of the package substrate 100*d* in FIG. 12 except for a reinforcement pattern. Thus, the same reference numerals may refer to the same elements and any further illustrations with respect to the same elements may be omitted herein for brevity.

Referring to FIGS. 16 and 17, a reinforcement pattern 160 of this example embodiment may have a thickness substantially the same as that of the first insulation layer 140. Thus, the vertical gap VG1 may not be formed between an upper surface of the reinforcement pattern 160 and the lower surface of the semiconductor chip. However, horizontal gaps HG2 substantially the same as the horizontal gaps HG1 in FIG. 15 may be formed between the side surface of the first conductive pattern 120 and a side surface of the reinforcement pattern 160, and between the side surfaces of the first conductive pattern 120 and the reinforcement pattern 160 and the inner surface of the opening 144.

In example embodiments, the reinforcement pattern 160 may include a first pattern 162 and a second pattern 164. The first pattern 162 may be arranged on the upper surface of the first conductive pattern 120. The second pattern 164 may be arranged on an upper surface of the first pattern 162. The second pattern 164 may have an upper surface configured to make contact with the lower surface of the semiconductor chip, particularly, the lower surface of the DAF.

The first pattern 162 may have a function substantially the same as that of the first pattern 152' in FIG. 12. The second pattern 164 may have a function substantially the same as that of the second pattern 154' in FIG. 12. Thus, any further illustrations with respect to the functions of the first and second patterns 162 and 164 may be omitted herein for brevity. Alternatively, the reinforcement pattern 160 may include a single layer or at least three-layered structure.

Semiconductor Package

Figure 18:
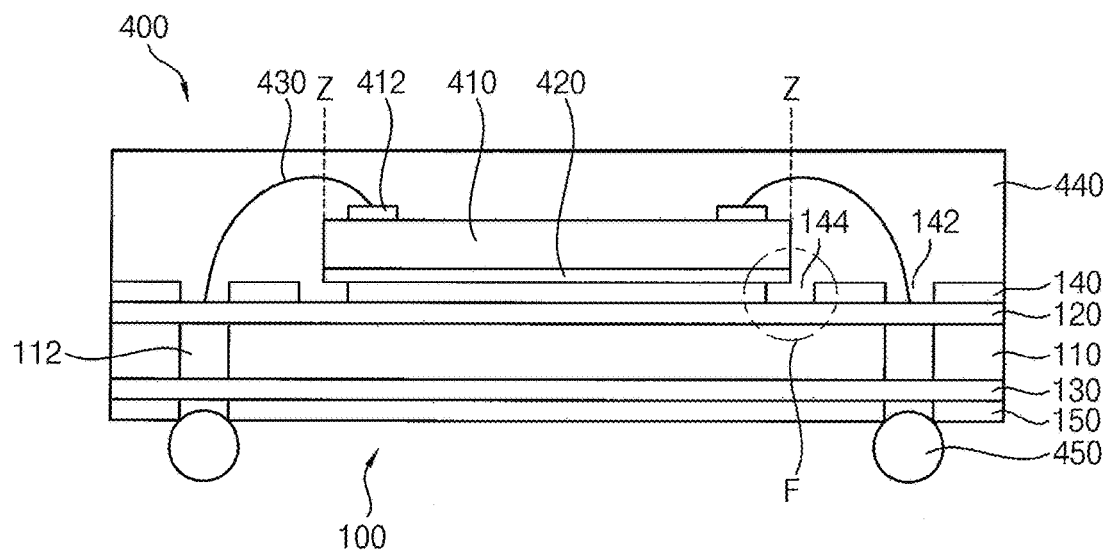
Figure 19:
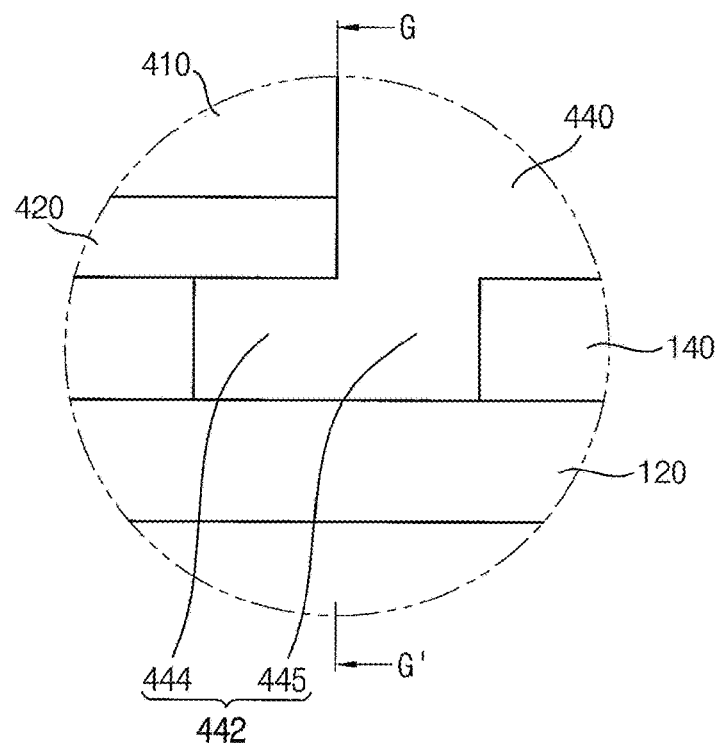
Figure 20:
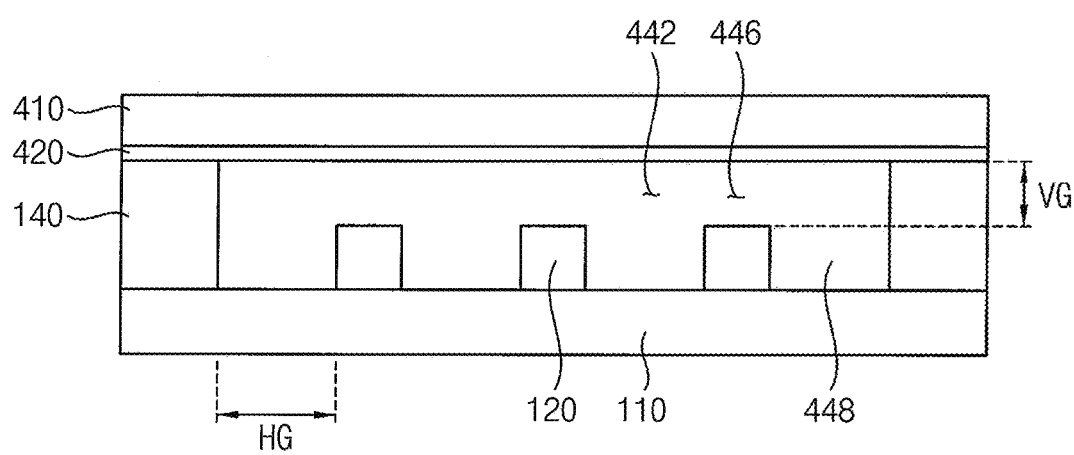

FIG. 18 is a cross-sectional view illustrating a semiconductor package including the package substrate in FIG. 1 in accordance with example embodiments, FIG. 19 is an enlarged cross-sectional view illustrating a portion "F" in FIG. 18, and FIG. 20 is a cross-sectional view taken along a line G-G' in FIG. 19.

Referring to FIGS. 18 to 20, a semiconductor package 400 of this example embodiment may include a package substrate 100, a semiconductor chip 410, a DAF 420, a conductive wire 430, a molding member 440 and external terminals 450.

The semiconductor package 400 of this example embodiment may include the package substrate 100 in FIG. 1. Thus, any further illustrations with respect to the package substrate 100 may be omitted herein for brevity. Alternatively, the semiconductor package 400 may include the package substrate 100a in FIG. 7, the package substrate 100b in FIG. 8 or the package substrate 100c in FIG. 10.

The semiconductor chip 410 may be arranged on a central portion of the upper surface of the package substrate 100. The semiconductor chip 410 may be attached to the upper surface of the package substrate 100 using the DAF 420. Pads 412 may be arranged on an upper surface of the semiconductor chip 410. As mentioned above, the openings 144 formed through the first insulation layer 140 of the package substrate 100 may be positioned under the side surface Z of the semiconductor chip 410. Thus, a gas, which may be generated in attaching the semiconductor chip 410 to the upper surface of the package substrate 100 using the DAF 420, may be effectively discharged through the opening 144. Therefore, a void caused by the remaining gas may not be generated between the DAF 420 and the package substrate 100.

The conductive wire 430 may be electrically connected between the semiconductor chip 410 and the package substrate 100. Particularly, the conductive wire 430 may be extended from the pad 412 of the semiconductor chip 410. The conductive wire 430 may be connected to the first conductive pattern 120 exposed through the pad opening 142.

The molding member 440 may be formed on the upper surface of the package substrate 100 to cover the semiconductor chip 410 and the conductive wire 430. Particularly, the opening 144 may be filled with the molding member 440. Thus, the molding member 440 may include a burying portion 442 configured to bury the opening 144. The molding member 440 may include an epoxy molding compound (EMC) having stiffness stronger than that of the solder resist of the first insulation layer 140. Thus, the burying portion 442 may function as to reinforce the adhesion force of the interface between the semiconductor chip 410 and the molding member 440. Further, the burying portion 442 may function as to suppress the spreading of the crack generated in the interface between the semiconductor chip 410 and the molding member 440 so that the crack may not spread into the first conductive pattern 120 of the package substrate 100.

The burying portion 442 may include an inner burying portion 444 configured to bury the inner opening 146, and an outer burying portion 445 configured to bury the outer opening 148. Particularly, the molding member 440 may include a vertical interlocking portion 446 inserted into the vertical gap VG formed between the upper surface of the first conductive pattern 120 exposed through the opening 144 and the lower surface of the semiconductor chip 410, particularly, the lower surface of the DAF 420. Further, the molding member 440 may include a horizontal interlocking portion 448 inserted into the horizontal gaps HG formed between the side surfaces of the first conductive patterns 120, and between the side surface of the first conductive pattern 120 and the inner surface of the opening 144. That is, the burying portion 442 may include the vertical interlocking portion 446 and the horizontal interlocking portion 448.

The vertical interlocking portion 446 and the horizontal interlocking portion 448 may provide the molding member 440 with an upper unevenness structure. Thus, the upper unevenness structure of the molding member 440 formed by the vertical interlocking portion 446 and the horizontal interlocking portion 448 may be combined with the lower unevenness structure formed by the first conductive patterns 120 to reinforce the adhesion force between the semiconductor chip 410 and the molding member 440.

The external terminals 450 may be mounted on the second conductive patterns 130 exposed through the openings 152 of the second insulation layer 150. The external terminals 450 may include solder balls.

Figure 21:
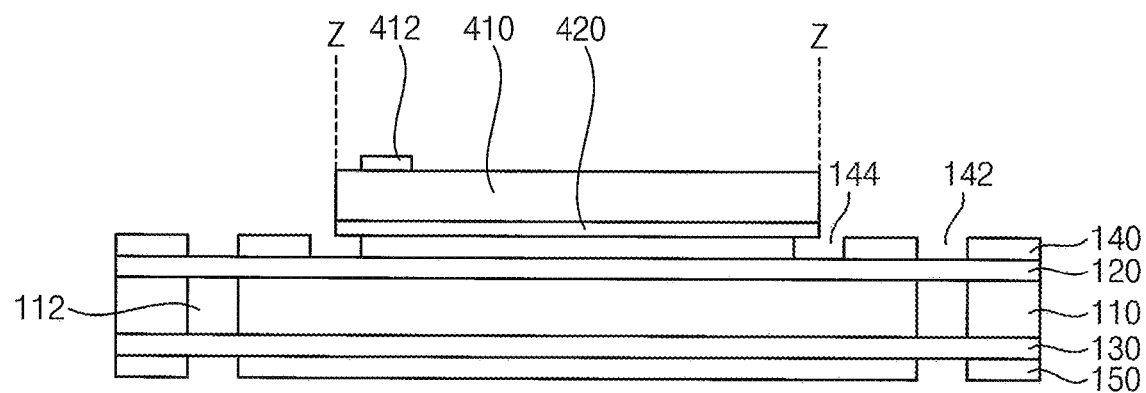
Figure 22:
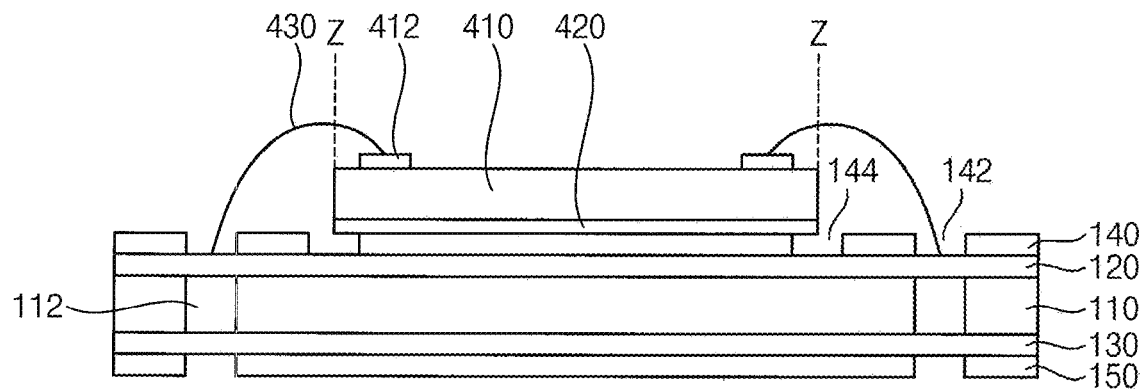
Figure 23:
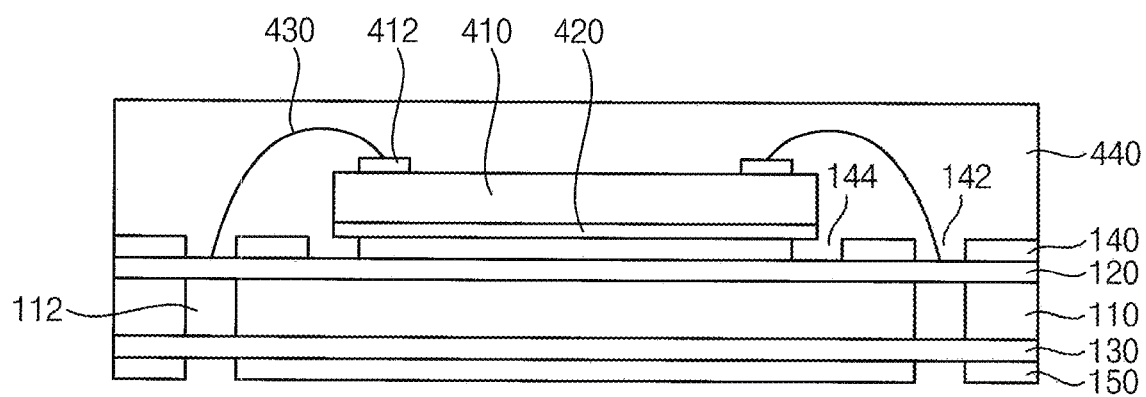

FIGS. 21 to 23 are cross-sectional views illustrating a method of manufacturing the semiconductor package in FIG. 18.

Referring to FIG. 21, the semiconductor chip 410 may be attached to the upper surface of the package substrate 100 using the DAF 420. The side surface Z of the semiconductor chip 410 may be positioned over the opening 144 of the package substrate 100.

Referring to FIG. 22, the pads 412 of the semiconductor chip 410 may be electrically connected to the first conductive patterns 120 exposed through the pad openings 142 using the conductive wire 430.

Referring to FIG. 23, the molding member 440 may be formed on the upper surface of the package substrate 100 to cover the semiconductor chip 410 and the conductive wire 430 with the molding member 440. The burying portion 442 of the molding member 440 may bury the opening 144 of the package substrate 100. Further, the vertical interlocking portion 446 may be inserted into the vertical gap VG formed between the upper surface of the first conductive pattern 120 and the lower surface of the DAF 420. The horizontal interlocking portion 448 may be inserted into the horizontal gaps HF formed between the side surfaces of the first conductive patterns 120, and between the side surface of the first conductive pattern 120 and the inner surface of the opening 144.

The external terminals 450 may be mounted on the second conductive patterns 130 exposed through the openings 152 of the second insulation layer 150 to complete the semiconductor package 400 in FIG. 18.

Figure 24:
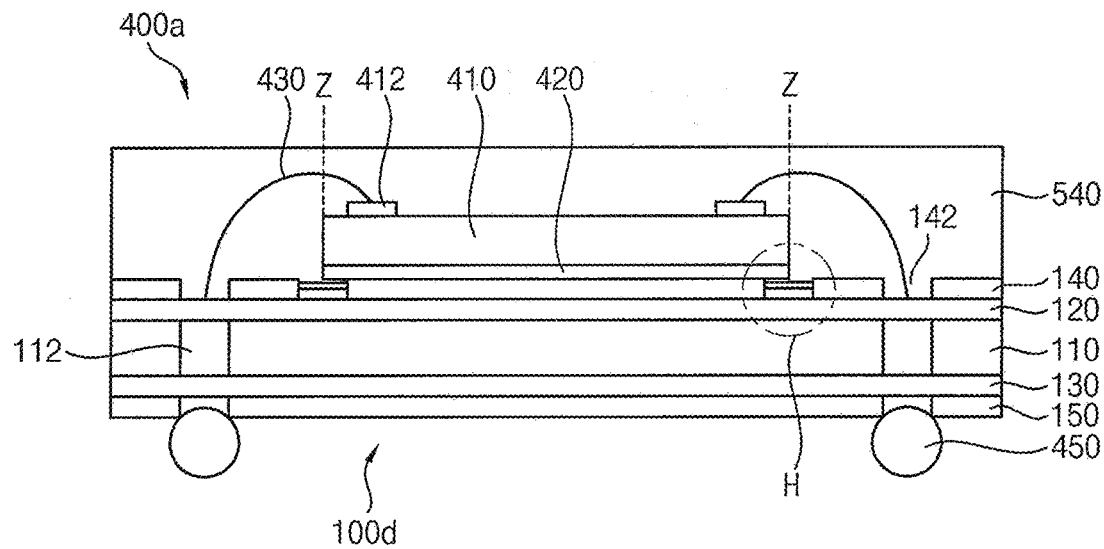
Figure 25:
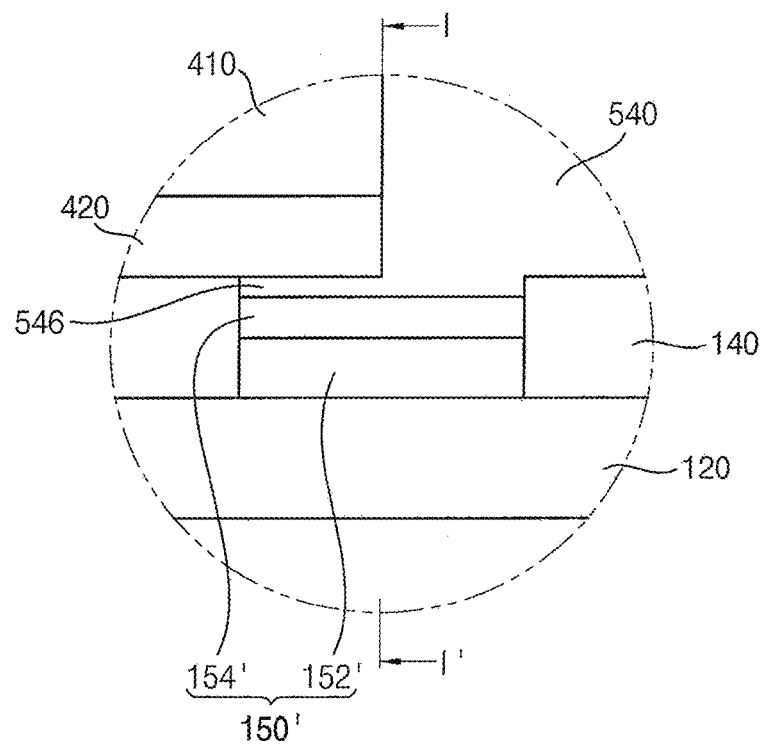
Figure 26:
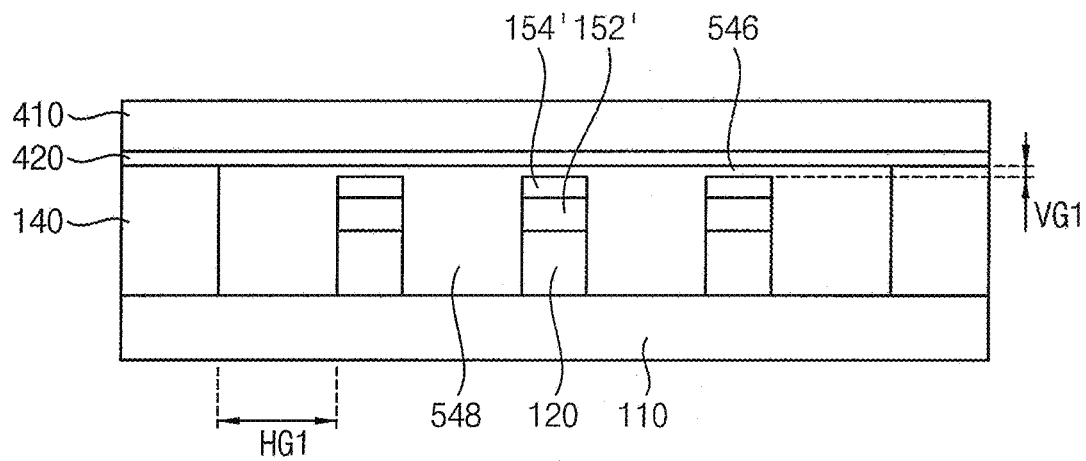

FIG. 24 is a cross-sectional view illustrating a semiconductor package including the package substrate in FIG. 12 in accordance with example embodiments, FIG. 25 is an enlarged cross-sectional view illustrating a portion "H" in FIG. 24, and FIG. 26 is a cross-sectional view taken along a line I-I' in FIG. 25.

Referring to FIGS. 24 to 26, a semiconductor package 400a of this example embodiment may include a package substrate 100d, a semiconductor chip 410, a DAF 420, a conductive wire 430, a molding member 540 and external terminals 450.

The semiconductor package 400a of this example embodiment may include the package substrate 100d in FIG. 12. Thus, any further illustrations with respect to the package substrate 100d may be omitted herein for brevity. Alternatively, the semiconductor package 400a may include the package substrate 100a in FIG. 7, the package substrate 100b in FIG. 8 or the package substrate 100c in FIG. 10.

Further, the semiconductor chip 410, the DAF 420, the conductive wire 430 and the external terminals 450 of the semiconductor package 400a may be substantially the same as the semiconductor chip 410, the DAF 420, the conductive wire 430, the molding member 540 and the external terminals 450 in FIG. 18, respectively. Thus, any further illustrations with respect to the semiconductor chip 410, the DAF 420, the conductive wire 430 and the external terminals 450 may be omitted herein for brevity.

The molding member 540 may be formed on the upper surface of the package substrate 100 to cover the semiconductor chip 410 and the conductive wire 430. The molding member 540 may include a burying portion 542 configured to bury the opening 144.

The molding member 540 may include a vertical interlocking portion 546 inserted into the vertical gap VG1 formed between the reinforcement pattern 150' on the upper surface of the first conductive pattern 120 and the lower surface of the DAF 420. Further, the molding member 540 may include a horizontal interlocking portion 548 inserted into the horizontal gaps HG1 formed between the side surfaces of the first conductive patterns 120 and the side surfaces of the reinforcement pattern 150', and between the side surfaces of the first conductive pattern 120 and the reinforcement pattern 150' and the inner surface of the opening 144.

Figure 27:
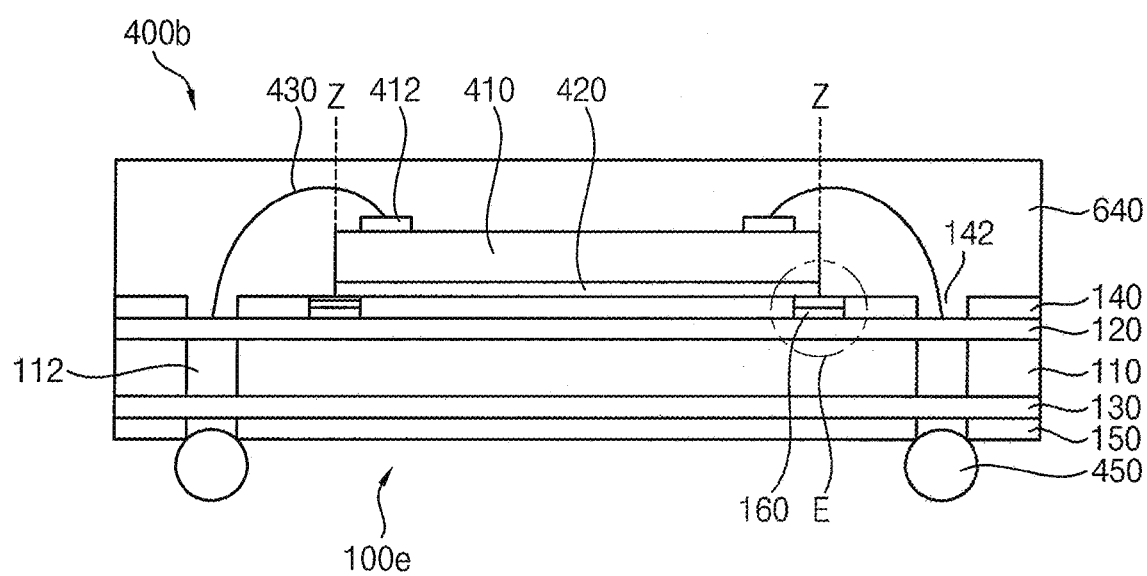
Figure 28:
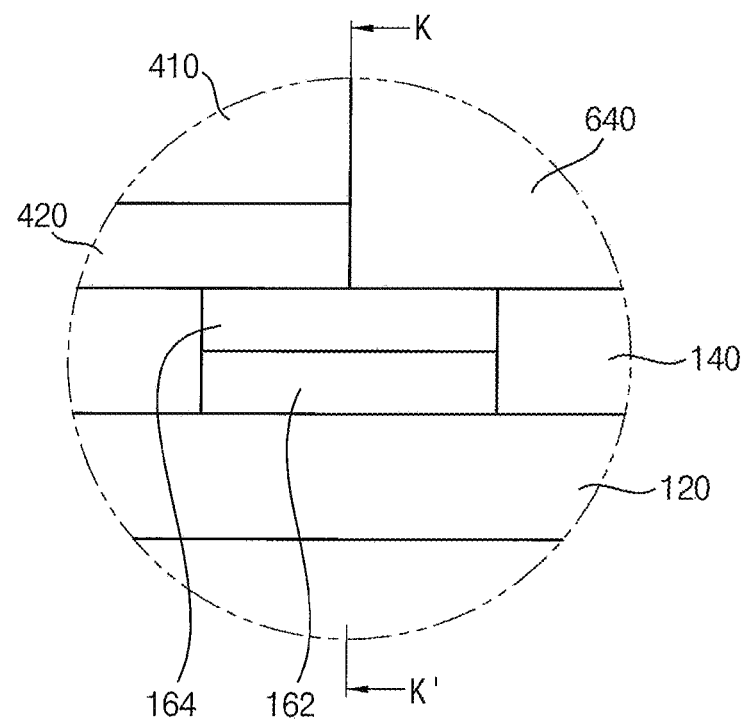
Figure 29:
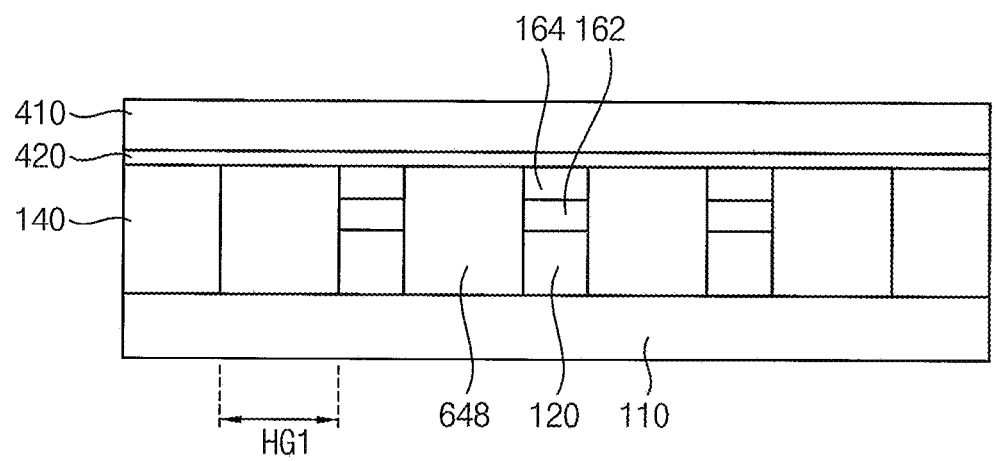

FIG. 27 is a cross-sectional view illustrating a semiconductor package including the package substrate in FIG. 16 in accordance with example embodiments, FIG. 28 is an enlarged cross-sectional view illustrating a portion "J" in FIG. 27, FIG. 29 is a cross-sectional view taken along a line K-K' in FIG. 28.

Referring to FIGS. 27 to 29, a semiconductor package 400b of this example embodiment may include a package substrate 100e, a semiconductor chip 410, a DAF 420, a conductive wire 430, a molding member 640 and external terminals 450.

The semiconductor package 400b of this example embodiment may include the package substrate 100e in FIG. 16. Thus, any further illustrations with respect to the package substrate 100e may be omitted herein for brevity. Alternatively, the semiconductor package 400a may include the package substrate 100a in FIG. 7, the package substrate 100b in FIG. 8 or the package substrate 100c in FIG. 10.

As mentioned above, because the reinforcement pattern 160 of the package substrate 100e may have the thickness substantially the same as the thickness of the first insulation layer 140, the vertical gap VG1 may not be formed between the upper surface of the reinforcement pattern 160 and the lower surface of the semiconductor chip 410. Thus, the molding member 640 may include only a horizontal interlocking portion 648 inserted into the horizontal gaps HG1 formed between the side surfaces of the first conductive patterns 120 and the side surfaces of the reinforcement pattern 150', and between the side surfaces of the first conductive pattern 120 and the reinforcement pattern 150' and the inner surface of the opening 144.

Figure 30:
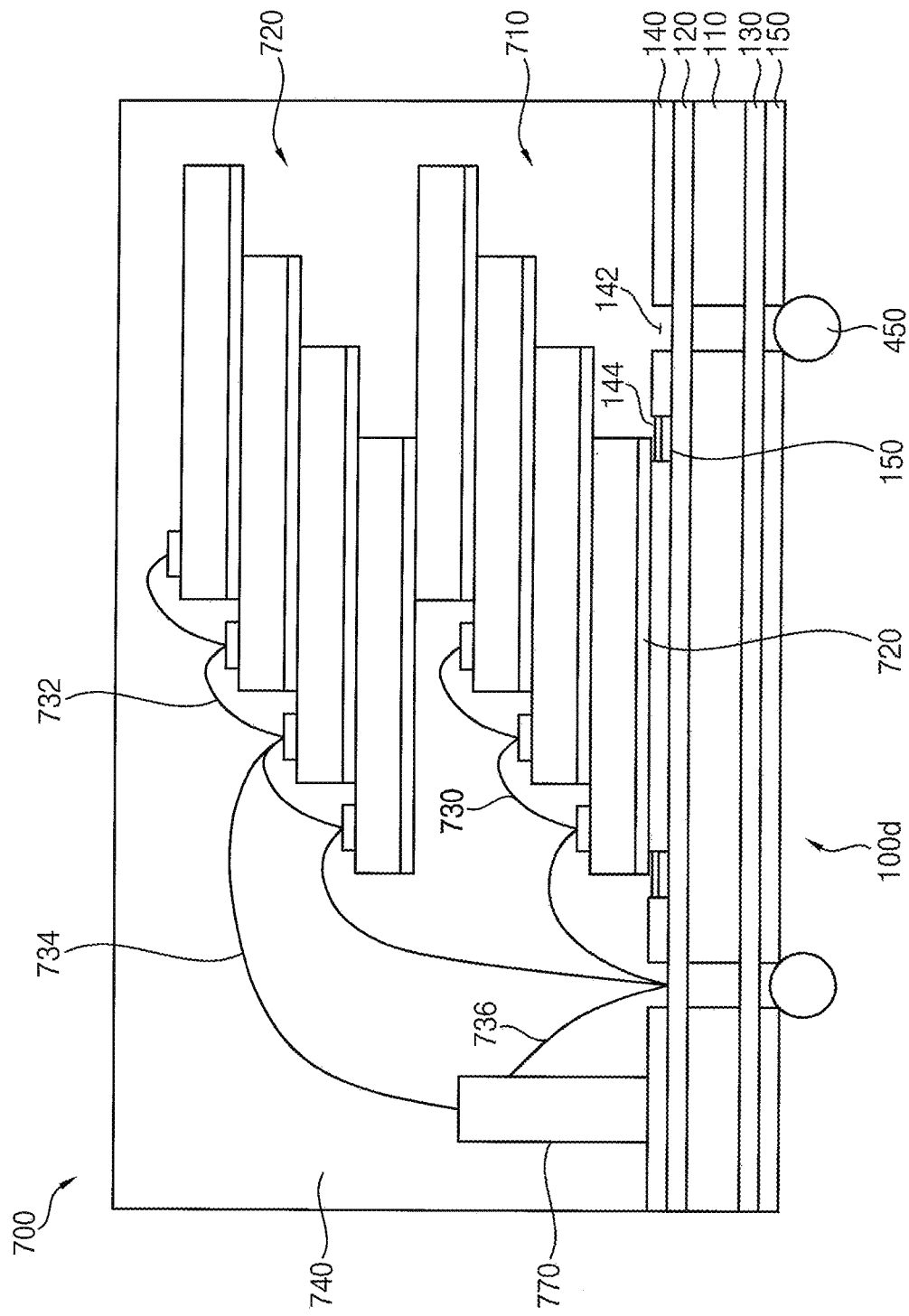

FIG. 30 is a cross-sectional view illustrating a semiconductor package including the package substrate in FIG. 12 in accordance with example embodiments.

Referring to FIG. 30, a semiconductor package 700 of this example embodiment may include a package substrate 100d, a plurality of first semiconductor chips 710, a plurality of second semiconductor chips 760, a control chip 770, a DAF 720, first conductive wires 730, second conductive wires 732, third conductive wires 734, fourth conductive wires 736, a molding member 740 and external terminals 750.

The semiconductor package 700 of this example embodiment may include the package substrate 100d in FIG. 12. Thus, any further illustrations with respect to the package substrate 100d may be omitted herein for brevity. Alternatively, the semiconductor package 700 may include the package substrate 100 in FIG. 1, the package substrate 100a in FIG. 7, the package substrate 100b in FIG. 8, the package substrate 100c in FIG. 10 or the package substrate 100e in FIG. 16.

The first semiconductor chips 710 may be stacked on the upper surface of the package substrate 100d in a step-like shape. The first conductive wires 730 may be electrically connected between the first semiconductor chips 710 with each other. A lowermost first semiconductor chip 710 among the first semiconductor chips 710 may be electrically connected with the package substrate 100d via the first conductive wire 730.

The second semiconductor chips 760 may be stacked on an upper surface of an uppermost semiconductor chip 710 among the first semiconductor chips 710 in a step-like shape. The second conductive wires 732 may be electrically connected between the second semiconductor chips 760 with each other. A lowermost second semiconductor chip 760 among the second semiconductor chips 760 may be electrically connected with the package substrate 100d via the second conductive wire 732.

The control chip 770 may be arranged on the upper surface of the package substrate 100d. The control chip 770 may be electrically connected with the first conductive pattern 120 of the package substrate 100d via the fourth conductive wire 736. Thus, the first semiconductor chips 710 may be electrically connected with the control chip 770. The second semiconductor chip 760 may be electrically connected with the control chip 770 via the third conductive wire 734.

The molding member 740 of this example embodiment may have a structure substantially the same as that of the molding member 540 in FIG. 24. Thus, any further illustrations with respect to the molding member 740 may be omitted herein for brevity.

Figure 31:
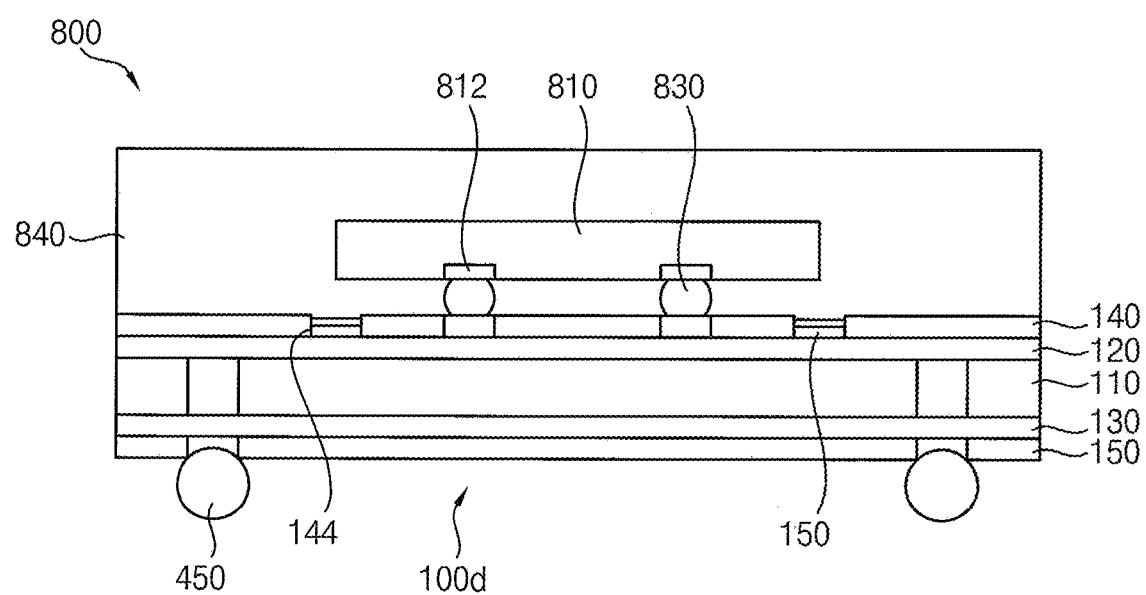

FIG. 31 is a cross-sectional view illustrating a semiconductor package including the package substrate in FIG. 12 in accordance with example embodiments.

Referring to FIG. 31, a semiconductor package 800 of this example embodiment may include a package substrate 100*d*, a semiconductor chip 810, conductive bumps 830, a molding member 840 and external terminals 850.

The package substrate 100*d* of the semiconductor package 800 may have a structure similar to that of the package substrate 100*d* in FIG. 12. The pad opening 142 of the package substrate 100*d* may be positioned under the semiconductor chip 810. Thus, any further illustrations with respect to the package substrate 100*d* may be omitted herein for brevity. Alternatively, the semiconductor package 800 may include the package substrate 100 in FIG. 1, the package substrate 100*a* in FIG. 7, the package substrate 100*b* in FIG. 8, the package substrate 100*c* in FIG. 10 or the package substrate 100*e* in FIG. 16.

Pads 812 may be arranged on a lower surface of the semiconductor chip 810. The conductive bump 830 may be interposed between the semiconductor chip 810 and the package substrate 100*d*. The conductive bumps 830 may be electrically connected between the pads 812 of the semiconductor chip 810 and the first conductive patterns 120 of the package substrate 100*d*.

The molding member 840 may be configured to bury the opening 144 of the first insulation layer 140. Particularly, the molding member 840 may be configured to fill a space between the semiconductor chip 810 and the package substrate 100*d*. That is, the spaces between the conductive bumps 830 may be filled with the molding member 840.

According to example embodiments, the opening may be formed at the portion of the first insulation layer under the interface between the side surface of the semiconductor chip and the molding member. Thus, during a process for attaching the semiconductor chip with the package substrate using a die attach film (DAF) and/or a process for forming the molding member, a gas generated from the DAF may be readily discharged through the opening. As a result, a void may not be generated in the interface between the semiconductor chip and the molding member.

Further, the opening may be filled with the molding member. Because the molding member may have stiffness stronger than that of the first insulation layer, a spreading of a crack, which may be generated at the interface between the side surface of the semiconductor chip and the molding member, toward the conductive patterns of the package substrate may be suppressed. Furthermore, the reinforcement pattern on the conductive pattern of the package substrate exposed through the opening may suppress the spreading of the crack toward the package substrate. Thus, damages to the conductive patterns of the package substrate by the crack may be limited and/or prevented.

Particularly, the conductive pattern and the reinforcement pattern may form the horizontal gap and the vertical gap filled with the molding member by the opening. Therefore, the conductive pattern and the reinforcement pattern may form an interlock structure having an unevenness shape together with the molding member in the horizontal gap and the vertical gap to reinforce an adhesion force between the semiconductor chip and the molding member.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts in the present application. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A package substrate comprising:
   first conductive patterns electrically connected with a semiconductor chip, the semiconductor chip including side surfaces, the first conductive patterns including lower surfaces;
   a first insulation layer on an upper surface and a side surface of each of the first conductive patterns, the first insulation layer including an opening under at least one of the side surfaces of the semiconductor chip; and
   a second insulation layer on the lower surfaces of the first conductive patterns.

2. The package substrate of claim 1, wherein the opening includes:
   an inner opening positioned inside the side surface of the semiconductor chip in a plan view; and
   an outer opening extending from the inner opening and positioned outside the side surface of the semiconductor chip in the plan view.

3. The package substrate of claim 2, wherein the inner opening has a length substantially the same as a length of the outer opening.

4. The package substrate of claim 1, wherein the opening is positioned inside the side surface of the semiconductor chip in a plan view.

5. The package substrate of claim 1, wherein the opening is positioned outside the side surface of the semiconductor chip in a plan view.

6. The package substrate of claim 1, wherein the opening is one of a plurality of openings arranged along any one of the side surfaces of the semiconductor chip.

7. The package substrate of claim 6, wherein the plurality of openings are arranged along all of the side surfaces of the semiconductor chip.

8. The package substrate of claim 1, wherein the opening is one opening extending along all of the side surfaces of the semiconductor chip.

9. The package substrate of claim 1, wherein the opening is configured to expose a corresponding one of the first conductive patterns.

10. The package substrate of claim 9, wherein the opening is configured to expose the upper surface and the side surface of the first conductive patterns to form a horizontal gap between an inner surface of the opening and the side surface of the first conductive patterns.

11. The package substrate of claim 10, further comprising:
    a reinforcement pattern on the corresponding one of the first conductive patterns, wherein
    the opening exposes the reinforcement patterns.

12. The package substrate of claim 11, wherein
a thickness of the reinforcement pattern is thinner than a thickness of the first insulation layer such that a vertical gap is between the reinforcement pattern and the semiconductor chip.

13. The package substrate of claim 11, wherein a thickness of the reinforcement pattern is substantially the same as a thickness of the first insulation layer.

14. The package substrate of claim 11, wherein the reinforcement pattern includes:
a first pattern on the first conductive patterns; and
a second pattern on an upper surface of the first pattern.

15. The package substrate of claim 14, wherein
the first pattern includes nickel, and
the second pattern comprises gold.

16. The package substrate of claim 1, further comprising:
a core insulation layer on the lower surfaces of the first conductive patterns; and
second conductive patterns between the core insulation layer and the second insulation layer, wherein
the second conductive patterns are electrically connected with the first conductive patterns.

17. A semiconductor package comprising:
a semiconductor chip, the semiconductor chip including side surfaces;
a package substrate including first conductive patterns electrically connected with the semiconductor chip, a first insulation layer on an upper surface and a side surface of each of the first conductive patterns and including an opening positioned under at least one of the side surfaces of the semiconductor chip, and a second insulation layer, the first conductive patterns including lower surfaces and the second insulating layer being on the lower surfaces of the first conductive patterns; and
a molding member on an upper surface of the package substrate to cover an upper surface and the side surfaces of the semiconductor chip, the molding member including a burying portion configured to bury the opening.

18. The semiconductor package of claim 17,
wherein the opening includes an inner opening positioned inside the side surface of the semiconductor chip in a plan view and an outer opening extending from the inner opening and positioned outside the side surface of the semiconductor chip in the plan view; and
the burying portion includes an inner burying portion configured to bury the inner opening and an outer burying portion configured to bury the outer opening.

19. The semiconductor package of claim 17, wherein the opening is configured to expose a corresponding one of the first conductive patterns, and the package substrate further includes a reinforcement pattern on a portion of the corresponding one of the first conductive patterns exposed through the opening.

20. The semiconductor package of claim 19, wherein
a vertical gap is between an upper surface of the reinforcement pattern and a lower surface of the semiconductor chip and the molding member includes a vertical interlocking portion inserted into the vertical gap, and
a horizontal gap is between the side surfaces of the reinforcement pattern and the side surfaces of the first conductive patterns and the molding member includes a horizontal interlocking portion inserted into the horizontal gap.

* * * * *